United States Patent [19]

Crall et al.

[11] 4,130,856
[45] Dec. 19, 1978

[54] HOUSING FOR MOUNTING ELECTRONIC CIRCUIT BOARDS ON AN ENGINE AIR FILTER HOUSING

[75] Inventors: Frederick W. Crall, Farmington; Lawrence W. Tomczak, Sterling Heights, both of Mich.

[73] Assignee: Chrysler Corporation, Highland Park, Mich.

[21] Appl. No.: 799,413

[22] Filed: May 23, 1977

Related U.S. Application Data

[60] Division of Ser. No. 659,297, Feb. 19, 1976, Pat. No. 4,050,093, which is a division of Ser. No. 587,193, Jun. 13, 1975, abandoned, which is a continuation-in-part of Ser. No. 570,540, Apr. 22, 1975, abandoned.

[51] Int. Cl.² .............................................. H05K 7/02
[52] U.S. Cl. ...................................... 361/415; 200/303; 200/307
[58] Field of Search ............... 361/395, 399, 412, 413, 361/415; 174/52 R, 52 S; 200/303, 307

[56] References Cited

U.S. PATENT DOCUMENTS

| | | | |
|---|---|---|---|
| 3,069,598 | 12/1962 | Daily et al. | 361/415 |
| 3,289,047 | 11/1966 | Pick | 361/415 X |
| 3,593,064 | 7/1971 | Wagner | 361/413 X |
| 3,601,661 | 8/1971 | Kleinhample | 361/395 X |
| 3,662,224 | 5/1972 | Rauch | 361/395 |
| 3,668,476 | 6/1972 | Wrabel et al. | 361/395 X |
| 3,814,990 | 6/1974 | Warman et al. | 361/412 X |
| 3,904,812 | 9/1975 | Daffron | 361/395 X |

*Primary Examiner*—Ira S. Lazarus
*Attorney, Agent, or Firm*—Baldwin & Newtson

[57] ABSTRACT

A housing containing a pair of electronic circuit boards removably mounts on the side of an engine air filter housing. The circuit board housing has a generally concave inner face matching the convex contour of the air filter housing side wall and is disposed over air circulation openings in the air filter housing side wall. In a first embodiment, the circuit board housing is of one-piece construction and the electronic circuit boards are disposed interiorly of the outer wall of the circuit board housing and in generally parallel relationship therewith. In a second embodiment, the circuit board housing is of two-piece construction having upper and lower halves. In this embodiment, the circuit boards are horizontally disposed, one each in each of the two housing halves. Connectors for effecting connection of the circuit boards with the other components of the system which are located exteriorly of the air cleaner housing extend through holes in the circuit board housing. The circuit boards contain electronic control circuitry for the engine, for example, an electronic engine spark timing control system. Other devices such as transducers may also mount on the circuit board housing.

12 Claims, 22 Drawing Figures

HOUSING FOR MOUNTING ELECTRONIC CIRCUIT BOARDS ON AN ENGINE AIR FILTER HOUSING

CROSS-REFERENCE TO RELATED APPLICATIONS

This application is a division of U.S. application Ser. No. 659,297 filed Feb. 19, 1976 U.S. Pat. No. 4,030,093 which is a division of U.S. application Ser. No. 587,193 filed June 13, 1975, abandoned which is a continuation-in-part of U.S. application Ser. No. 570,540 filed Apr. 22, 1975 abandoned.

BACKGROUND AND SUMMARY OF THE INVENTION

This invention relates to a novel arrangement for mounting electronic circuit boards in the engine compartment of a vehicle.

Among the features and objects of the present invention are to provide an improved mounting arrangement for electronic circuit boards: which can be easily assembled into and disassembled from an engine air filter housing; in which the circuit components are protected from contamination; in which the components are adequately thermally protected even though contained in the engine compartment; which provides easy connectability to other system components; and which offers other advantages and benefits as will appear more fully hereinafter.

BRIEF DESCRIPTION OF THE DRAWINGS

The drawings illustrate preferred embodiments of the present invention according to the best mode presently contemplated in carrying out the invention.

FIG. 6 is a fragmentary top plan view having portions broken away illustrating a second embodiment of circuit board housing according to the present invention.

DESCRIPTION OF THE PREFERRED EMBODIMENTS

Figure 1:
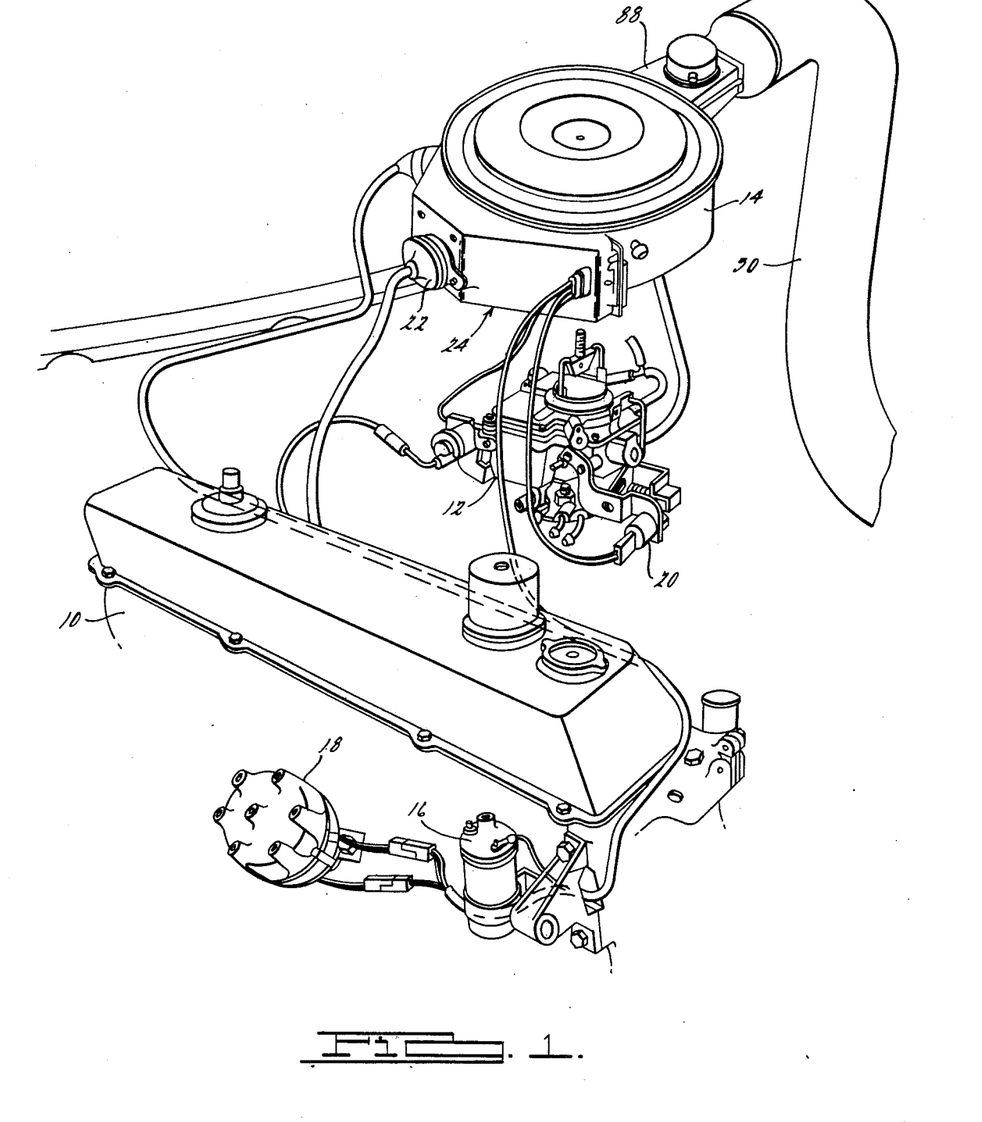
FIG. 1 is a fragmentary exploded perspective view of a portion of a typical vehicle engine compartment including a first embodiment of circuit board housing according to the present invention.

In FIG. 1 there is shown a portion of a typical vehicle engine compartment including an engine 10, a carburetor 12, an air filter housing 14, an ignition coil 16, and a distributor 18. The engine further includes an electronic control system for example, an engine spark timing controller which controls the timing of the ignition spark in relation to certain control inputs. For example, one input may be the throttle position as monitored by a throttle position transducer 20 and another may be the engine manifold vacuum as monitored by a vacuum transducer 22.

Figures 2, 3:
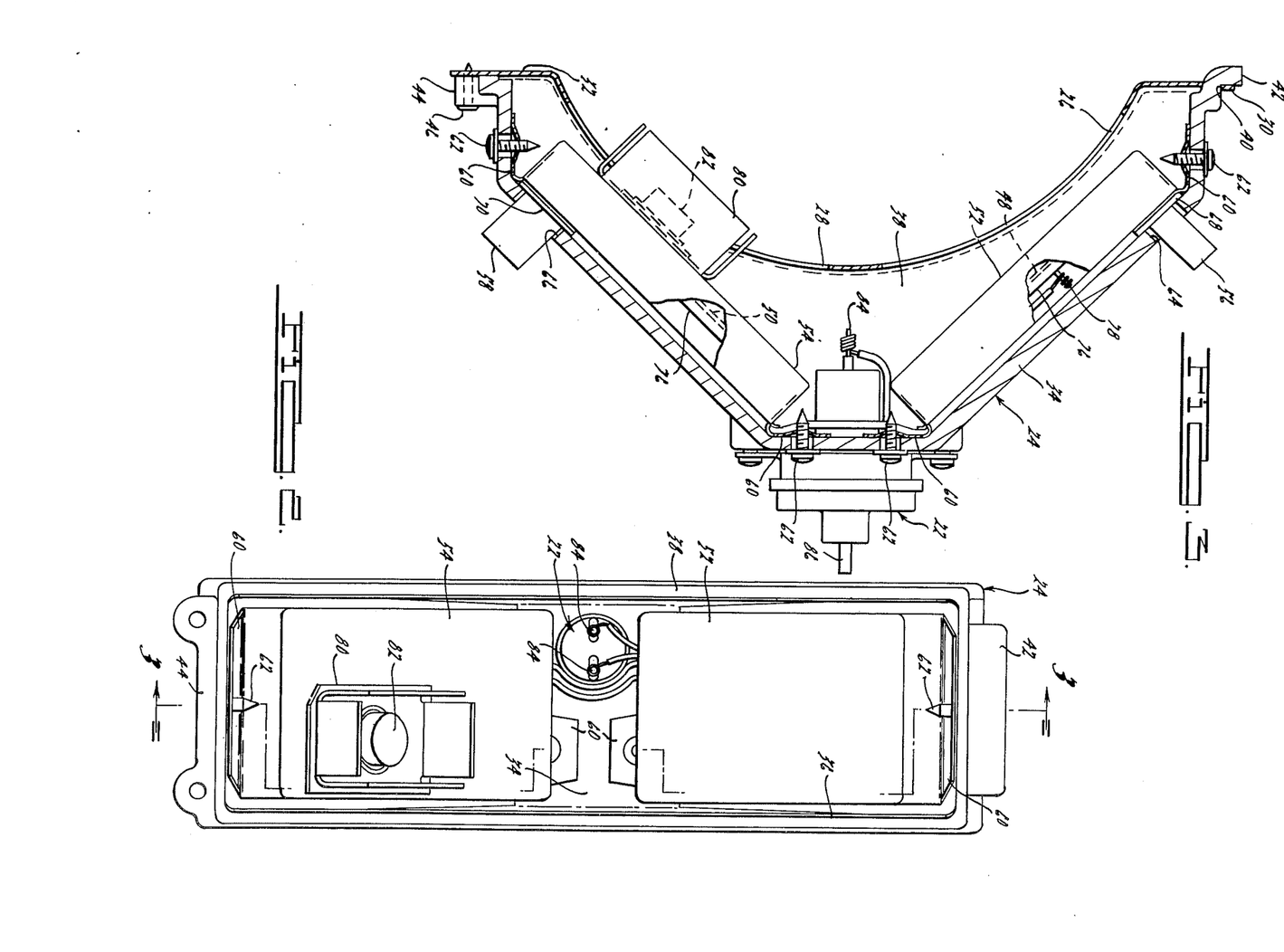
FIG. 2 is a view showing the interior of the circuit board housing of FIG. 1 by itself with the circuit boards and their receptacles contained therein.
FIG. 3 is a sectional view taken along lines 3—3 in FIG. 2.

The present invention is concerned with a novel mounting arrangement for mounting the electronic circuitry of the electronic control system in the engine compartment. More specifically, the present invention, in a first embodiment as shown in FIGS. 1 through 5, provides a circuit board housing 24 which removably mounts on air cleaner housing 14. Details of housing 24 are shown in FIGS. 1, 2 and 3. Housing 24 preferably is a molded plastic element suitable for use with the higher temperatures which are generally encountered in the engine compartment; for example, glass-filled nylon or glass-filled polyester are suitable. Housing 24 is of generally concave shape with the inner face thereof facing radially inwardly of air filter housing 14. Air filter housing 14 is generally conventional; however, in accordance with the principles of the present invention the side wall of housing 14 is provided with one or more air circulation openings over which circuit board housing 24 is disposed. Such openings are illustratively shown at 26 and 28 in FIG. 3. Attachment means for attaching circuit board housing 24 to air cleaner housing 14 are provided in the form of outwardly turned tabs 30 and 32 on the side wall of air filter housing 14. Circuit board housing 24 is provided with a radially outer wall 34 which extends between the points at which it attaches to air filter housing 14. This outer wall 34 is parallel to the axis of the air filter housing but is spaced radially outwardly from the nominal diameter of the air filter housing. Circuit board housing 24 further includes a top wall 36 and a bottom wall 38 which project radially inwardly from the outer wall 34. Both top and bottom walls 36, 38 have their inner peripheries generally circularly contoured to match the contour of the side wall of housing 14 so that the circuit board housing seats on the air filter housing.

Housing 24 removably mounts on housing 14 in the following fashion. Tab 30 is provided with a slot 40 into which the free end of a right angle projecting flange 42 on one end of housing 24 may be inserted. With the housing 24 appropriately oriented to permit insertion of the free end of edge 42 into slot 40, the edge is inserted into the slot, and housing 24 is pivoted thereabout to bring the housing to the position shown in FIG. 3. A pair of holes are provided in tab 32 and matching clearance holes in the juxtaposed edge 44 of housing 24 so that attachment screws 46 may be inserted through the clearance holes to engage the holes in tab 32 and secure the attachment. With housing 24 secured to housing 14 it will be noted that the free edge 42 interlocks behind tab 30.

Figures 4, 5:
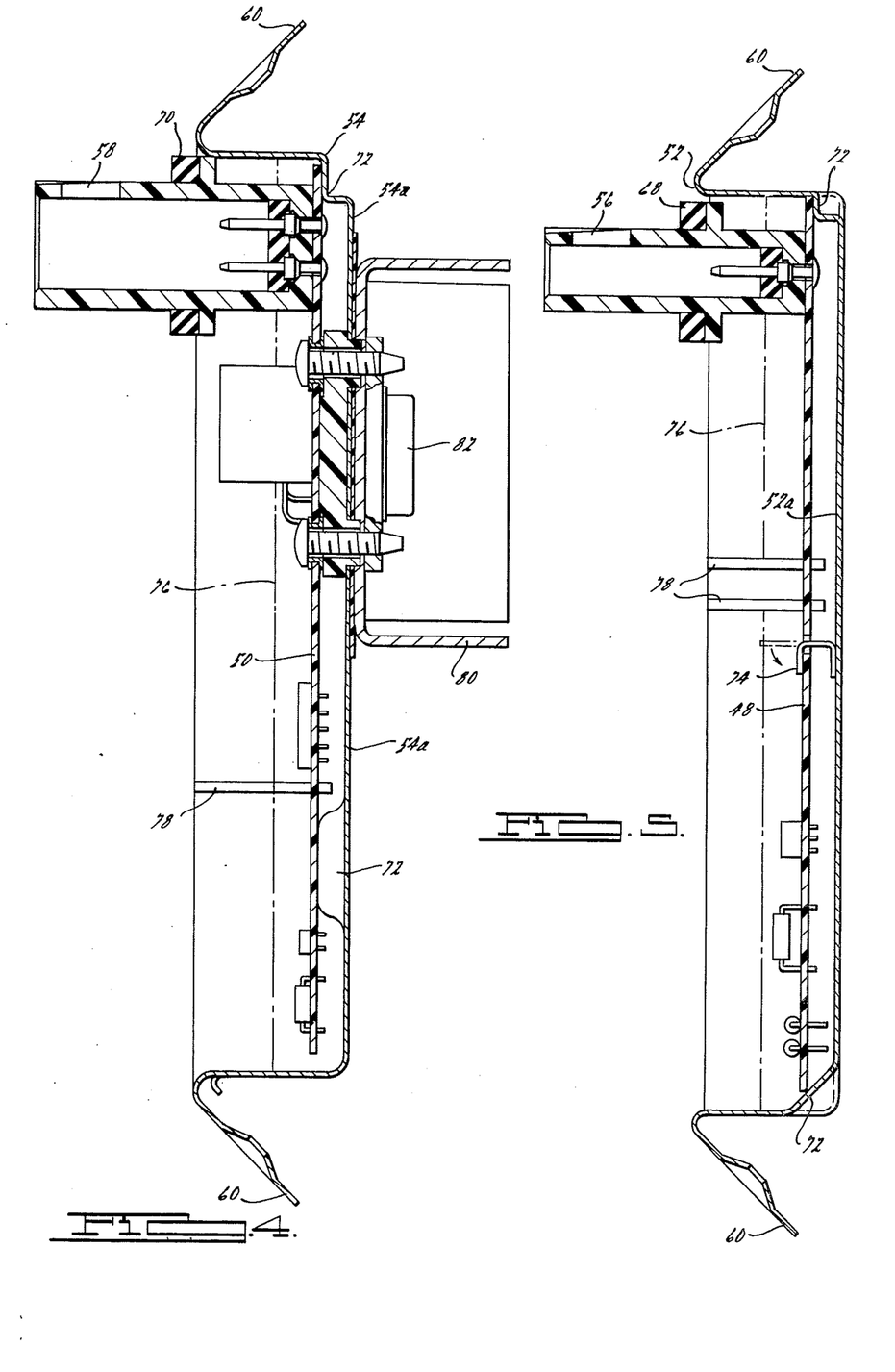
FIG. 4 is an enlarged sectional view through one of the circuit boards and its receptacle shown in FIG. 2.
FIG. 5 is a sectional view through the other circuit board and its receptacle shown in FIG. 2.
Figure 5:
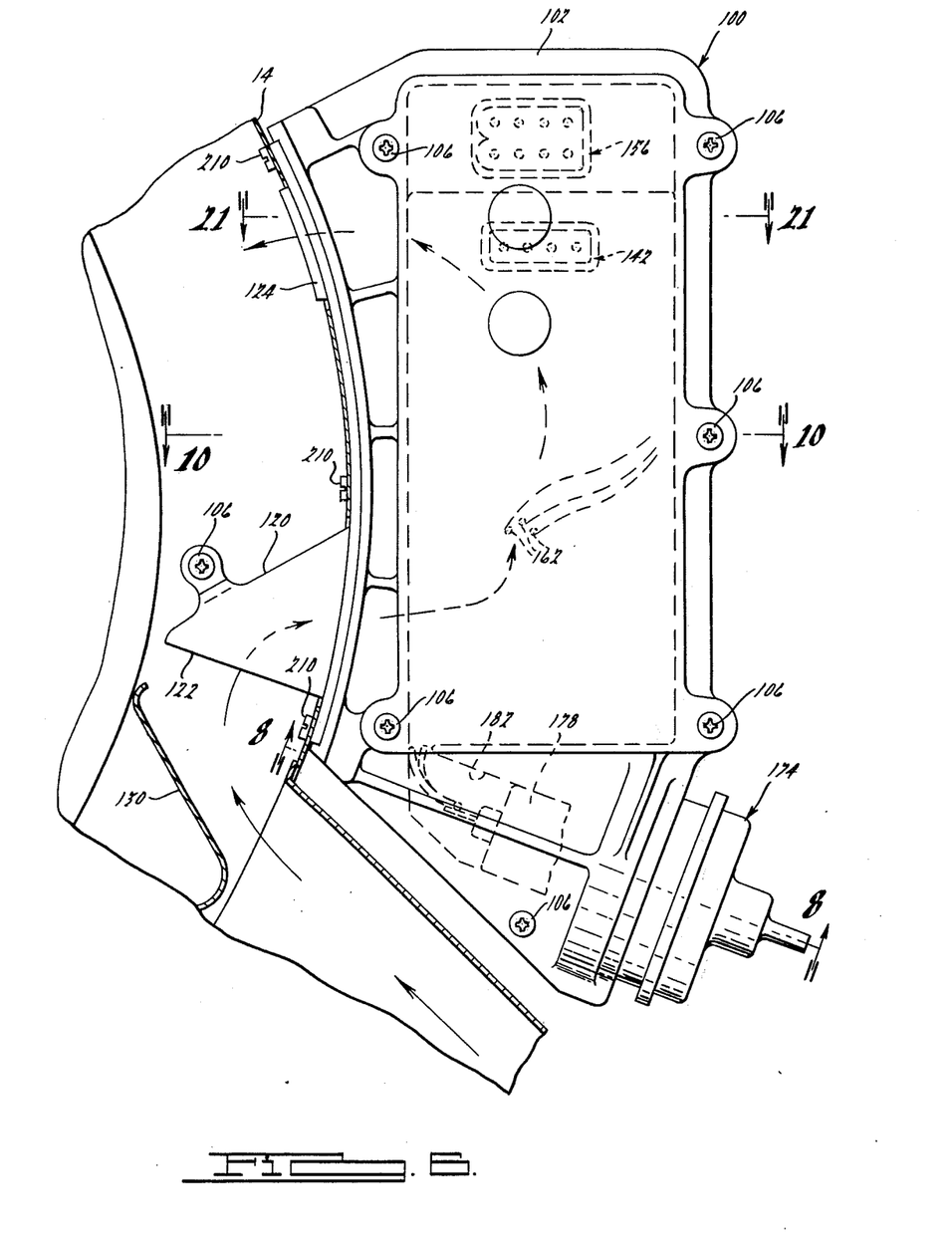
Figure 7:
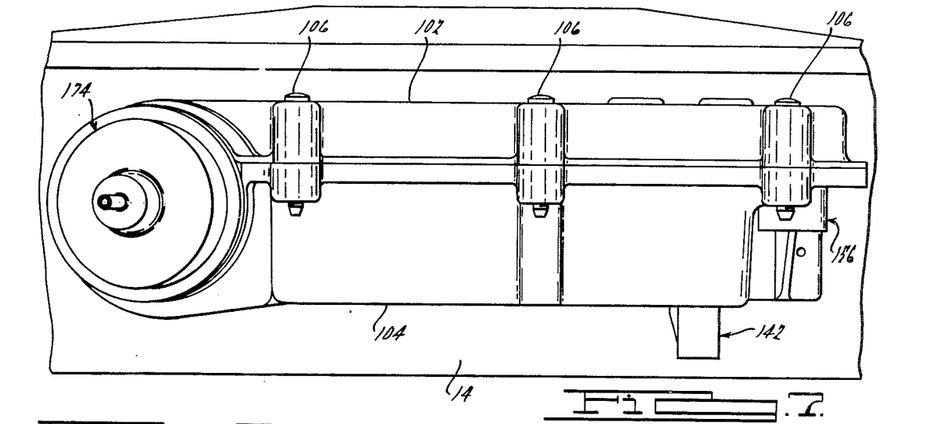
FIG. 7 is a fragmentary side elevational view of FIG. 6.

A pair of electronic circuit board assemblies 48 and 50 are mounted interiorly of housing 24 within a pair of sheet metal receptacles 52 and 54 respectively. Greater details of the two circuit board assemblies 48, 50 and their respective receptacles 52, 54 are shown in FIGS. 4 and 5. The circuit board of each circuit board assembly is of rectangular shape and contains thereon a large number of the electronic circuit components forming electronic circuits of the engine control system. Each sheet metal receptacle has a rectangular shape similar to that of the corresponding circuit board assembly. Each circuit board assembly also contains an electrical connector plug which mates with a mating connector plug (not shown in FIGS. 2–5) to effect electrical connection of the circuits on the circuit board assembly with components of the system which are external to the circuit board assemblies. The connector plug for circuit board assembly 48 is designated by the reference numeral 56 and that for circuit board assembly 50 by the reference numeral 58.

Each circuit board assembly 48, 50 and its corresponding receptacle form an individual unit which removably mounts on wall 34 of housing 24. The circuit board assemblies are potted in their respective receptacles, and the receptacles are provided with apertured side flanges, or tabs, 60 via which the units attach to wall 34 by means of attaching screws 62. Clearance holes 64, 66 are provided in wall 34 for connector plug 56, 58 respectively, and annular gaskets 68, 70 seal between each connector plug and its clearance hole 64, 66.

Each circuit board assembly 48, 50 mounts within its receptacle 52, 54 in the following fashion. There are provided in the radially inner wall 52a, 54a of each receptacle several localized indentations illustratively indicated by the reference numeral 72. Each receptacle is oriented with its wall 52a, 54a horizontal and its iterior facing up. The circuit board assemblies are positioned within their receptacles to rest on indentation 72, thereby providing a clearance space between each board and the wall 52a, 54a of its receptacle. If necessary, one or more bendable retention tabs, such as 74, may be provided on a receptacle to assist in holding and locating the circut board. A suitable potting compound is then poured into the receptacle to a desired fill level 76 sufficient to cover the circuit board and virtually all the individual electronic circuit components thereon. Because indentations 72 are only localized and because the overall dimensions of each circuit board are slightly less than those of its receptacle, the potting compound flows around the edges of the board to substantially fill the space between the board and the receptacle wall. It may be found desirable to facilitate filling by providing holes in the circuit board. Once the receptacle has been filld, the potting compound is allowed to cure into a rubbery-like encapsulant. Electrical terminals, such as 78 may protrude above the fill level 76 to provide for connection internally of housing 24, for example between the two circuit boards. Other devices may mount on the units, for example a heat sink 80 for a power transistor 82 used in the circuitry associated with board 50.

It is contemplated that other devices may mount on housing 24, for example vacuum transducer 22, which mounts on wall 34 between the two circuit board receptacles. Electrical terminals 84 for transducer 22 are interior of housing 24 and may connect by lead wires with selected terminals 78. A nipple 86 to which manifold vacuum is conducted is located exteriorly so that a vacuum hose may be inserted thereon.

An especially good potting material for the units is silicone rubber, such as Dow-Corning "Sylgard" or General Electric "RTV627." This material posses physical properties which are especially desirable with the present invention. For example, the material exhibits excellent dielectric characteristics, very low thermal conductivity, remains reasonably pliable at very low temperatures and retains its shape at very high temperatures. Because of its low thermal conductivity, the potting material thermally insulates those components which it covers. Because of the extremely low power dissipation of most of the electrical circuit components mounted on the circuit boards, these components can be completely covered by potting material. However, if a component dissipates a larger amount of heat, it may be desirable to expose same to the interior of housing 24. With the engine operating, the present invention affords a certain air circulation within housing 24 caused by the induction effect of air drawn into the carburetor through the air filter housing. Even though the snorkel 88, via which air enters the air filter housing is located essentially diametrically opposite circuit board housing 24, the provision of air circulation openings 26, 28 exposes the interior of housing 24 to the interior air filter housing 14 so that air flow and air turbulence within housing 14 generate air currents within housing 24 across the receptacle and circuit board assembly units. Thus, in the case of transistor 82 and its heat sink 80, there is provided a certain convective cooling. In order to maintain the temperature of the intake air as close to ambient as possible, it may be beneficial to connect air intake hose 90 to snorkel 88 so that air can be gathered at a location remove from the engine compartment. If desired, either or both the hose 90 and the air filter housing 14 may be covered with insulation to further minimize temperature rise in the induction air. With the invention it is possible t accurately sense the ambient air temperature by means of a temperature responsive element such as a thermistor mounted in circuit on one of the circuit boards, but projecting from its receptacle to be disposed in the air within the housing. It may also be desirable to provide an air scoop or diverter at one of the air circulation openings to promote air circulation within the housing.

The second embodiment of the present invention shown in FIGS. 6 through 22 possesses a number of features which are different from those of the first embodiment. The second embodiment comprises a circuit board housing 100 which is of two-piece construction. Specifically, housing 100 comprises a molded plastic element 102 forming the upper half of the housing and a second molded plastic element 104 forming the lower half of the housing. The two housing elements are detachably secured together along their mating surfaces by means of a plurality of attachment screws 106 which extend through holes in bosses formed at intervals around the two elements.

Figures 11, 12, 13, 14:
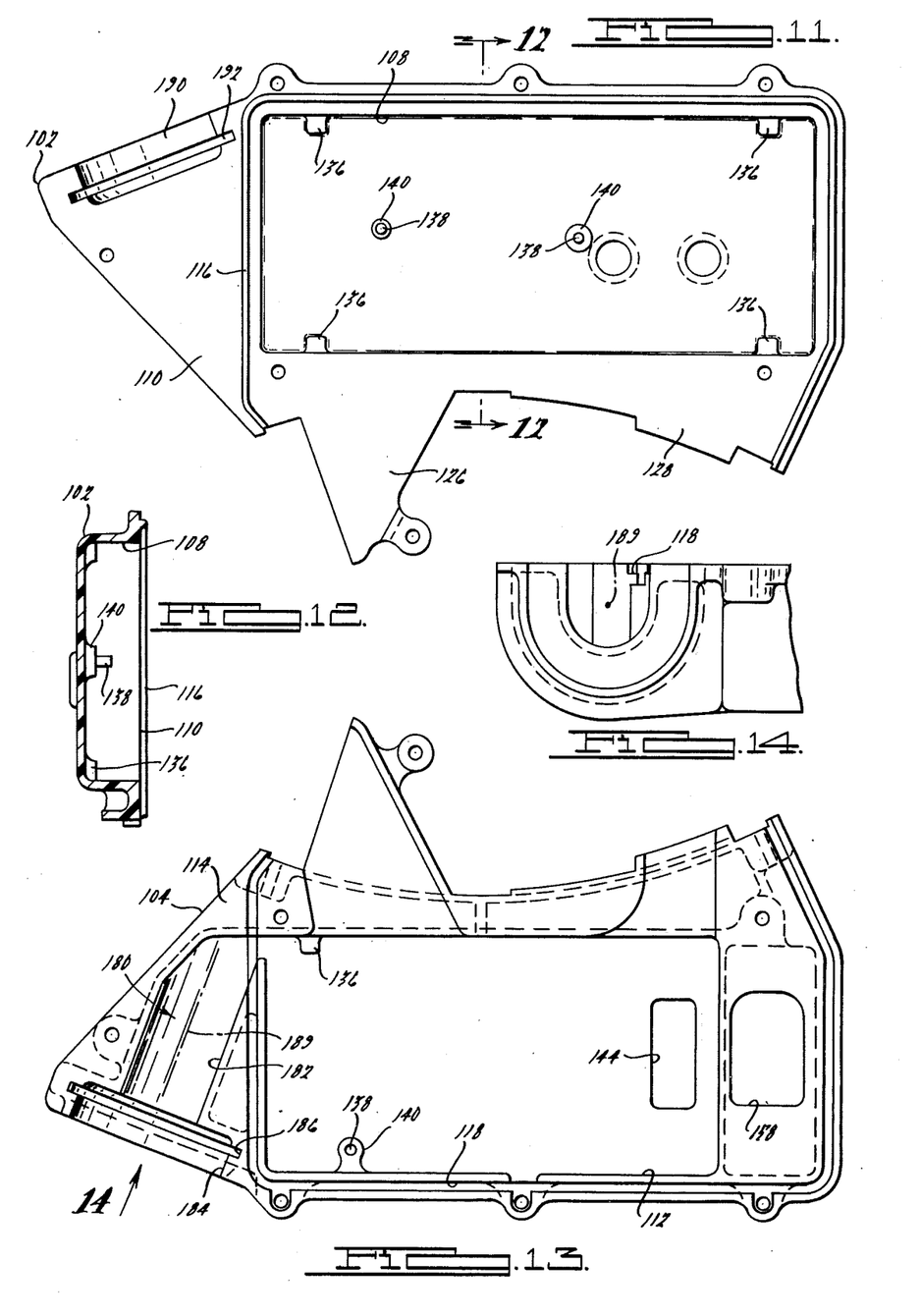
FIG. 11 is a plan view of the interior of the upper half of the circuit board housing of FIG. 6 shown by itself.
FIG. 12 is a sectional view taken in the direction of arrows 12—12 in FIG. 11.
FIG. 13 is a plan view of the interior of the lower half of the circuit board housing shown in FIG. 6.
FIG. 14 is a fragmentary view taken in the direction of arrow 14 in FIG. 13.

Details of the upper and lower housing elements 102, 104 are best shown in FIGS. 11 through 14 which illustrate the two housing elements by themselves. As can be seen in FIGS. 11 and 12, upper housing element 102 comprises a rectangularly shaped circuit-board-receiving pocket 108. The mating surface 110 of element 102 which mates with lower housing element 104 lies in a flat plane which is disposed horizontally when housing 100 is mounted on air filter housing 14. Similarly, lower housing element 104 has a rectangularly shaped circuit-board-receiving pocket 112 and a mating surface 114, which mates with surface 110 when the two elements 102, 104 are assembled together. However, the two mating surfaces 110, 114 are not necessarily contiguous throughout. In order to provide a seal between the upper and lower housing elements around three sides of the two circuit-board-receiving pockets 108, 112, there is provided on element 102 a raised bead 116 on surface 110 extending around three sides of pocket 108. There is also provided in element 104 a complementary recess 118 in which bead 116 lodges when the two housing halves are assembled. By making the height of bead 116 slightly greater than the depth of recess 118 throughout their respective lengths, a continuous sealing contact is effected between the two when assembled. Accordingly, it will be appreciated that the matin surfaces 110, 112 are not necessarily in continuous contact with each other throughout. This feature has the advantage of eliminating the need for a separate sealing gasket between the two housing halves.

Considering FIGS. 6 and 11 through 14 in greater detail, one will observe that housing 100 is further endowed with an intake air scoop 120 having an intake opening 122 and an air discharge outlet 124 which is spaced circumferentially of scoop 120. The top wall of air scoop 120 is provided by the triangularly shaped projection 126 in element 102 while the remainder of the air scoop is formed in lower element 104. Similarly, the top of discharge outlet 124 is provided by the portion 128 of element 102 and the remainder thereof in element 104. With the two housing elements assembled together, and mounted on air filter housing 14 as shown in FIG. 6, induction air entering through the air cleaner snorkel is drawn in the direction of the arrows into scoop 120, passing through the interior of housing 100 and discharging at outlet 124. Air flow through the housing may be promoted by the location of an upstanding diverter 130 adjacent the intake opening 122 of scoop 120. As will become apparent, the air flow circulation through housing 100 provides effective cooling for the electronic circuit components contained within the housing.

Figures 8, 9, 10:
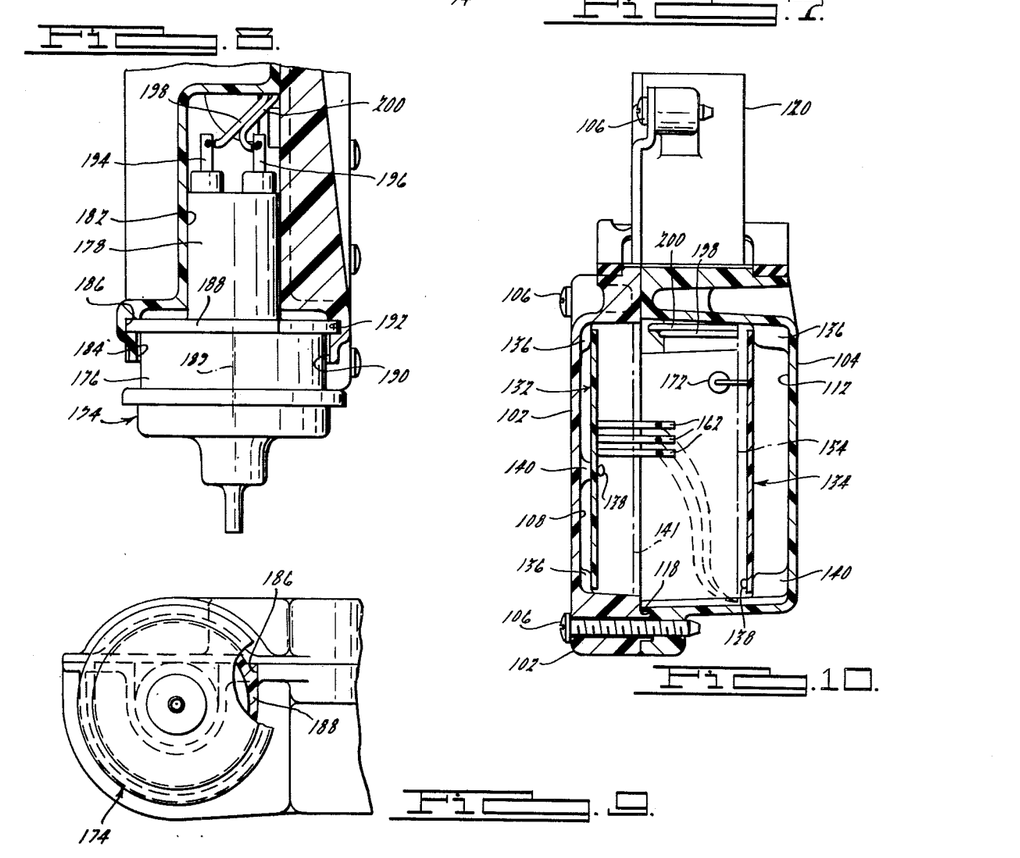
FIG. 8 is a fragmentary sectional view taken in the direction of arrows 8—8 in FIG. 6.
FIG. 9 is a fragmentary end view of FIG. 8.
FIG. 10 is a sectional view taken in the direction of arrows 10—10 in FIG. 6.
Figure 21:
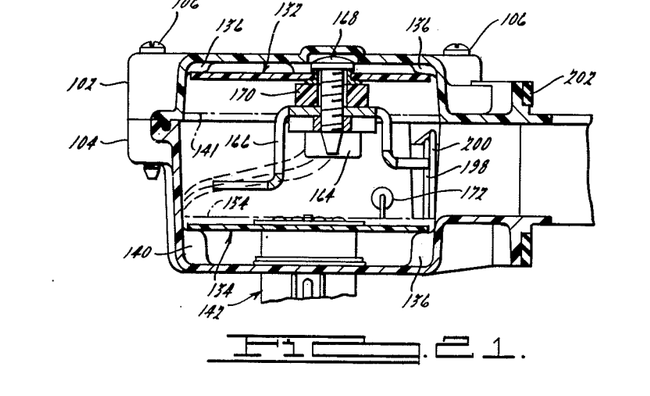
FIG. 21 is a fragmentary sectional view in the direction of arrows 21—21 in FIG. 6.

Looking now at FIGS. 10 and 21, along with FIGS. 11-14, a first electronic circuit board assembly 132, containing a number of electronic circuits thereo (which are not illustrated in the drawing for the sake of clarity), is contained within pocket 108 while a second electronic circuit board assembly 134 is contained within pocket 112. Desirably, each circuit board is potted within its respective housing element by means of suitable potting material. An advantage of the instant arrangement concerns assembly of each circuit board assembly into its corresponding housing element which is as follows. With the interior of the housing element pocket facing upwardly, the appropriate circuit board assembly is placed within its pocket so that the circuit board itself rests upon one or more individual ledges 136 which are provided in the pocket. For the first circuit board assembly, there are provided four ledges 136 (FIG. 11) within pocket 108, and these ledges are formed integrally with element 102. A feature is to provide one or more locating pins in element 102 which facilitate the correct location of the circuit board assembly within the pocket and which can prevent the circuit board assembly from being oriented 180° from the position which it should occupy. For example, element 102 is provided with a pair of integral locating pins 138 which project upwardly from raised bosses 140 formed within pocket 108. The circuit board of circuit board assembly 132 is provided with a matching hole pattern to permit the circuit board assembly to be located on pin 138 so that the circuit board itself comes to rest on the ledges 136 and the bosses 140. With the circuit board thus located, the locating pins 138 protrude substantially above the surface of the circuit board and may be deformed, as by heat staking, into a blob (as shown in FIG. 10) which retains the circuit board assembly in the desired position. Potting material may now be poured into the pocket to a desired fill level 141 after which the material is allowed to cure into a rubbery-like encapsulant for the circuit board and most of the components thereon. As mentioned in connection with the first embodiment, filling is facilitated by providing one or more openings in the circuit board to permit the potting material to flow around and beneath the circuit board to avoid unfilled pockets upon curing.

Figures 15, 16:
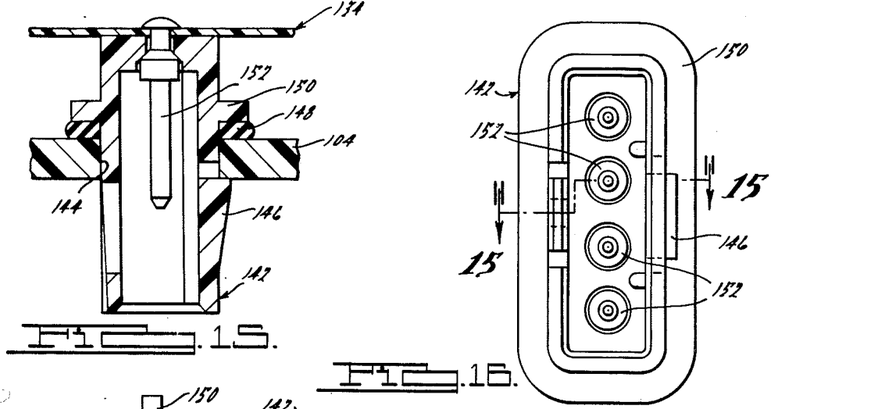
FIG. 15 is a sectional view taken through one of the electrical connector plugs included in the arrangement of FIG. 6 and is taken in the direction of arrows 15—15 in FIG. 16.
FIG. 16 is a plan view of the connector plug shown in FIG. 15.
Figure 17:
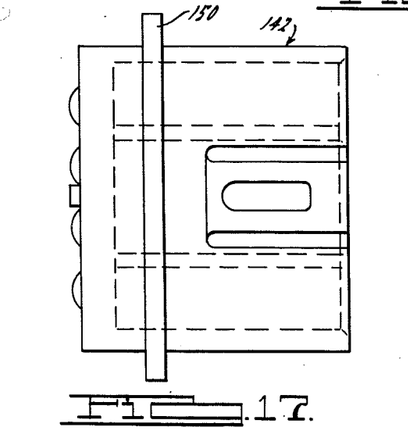
FIG. 17 is a side view of the connector plug in FIG. 16.
Figure 18:
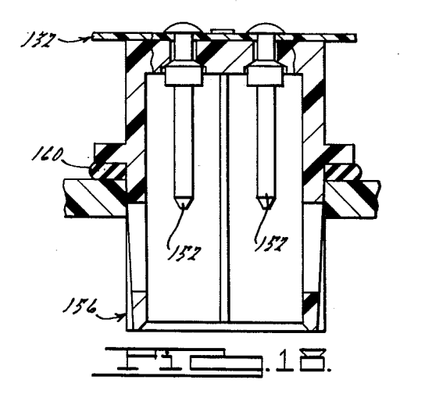
FIG. 18 is a sectional view through the other connector plug included in the arrangement of FIG. 6 and is taken in the direction of arrows 18—18 in FIG. 19.
Figure 19:
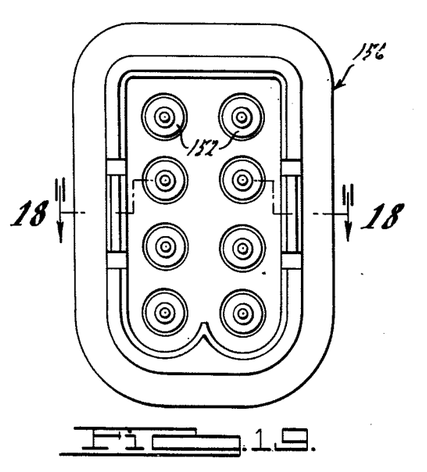
FIG. 19 is a plan view of the connector plug of FIG. 18.
Figure 20:
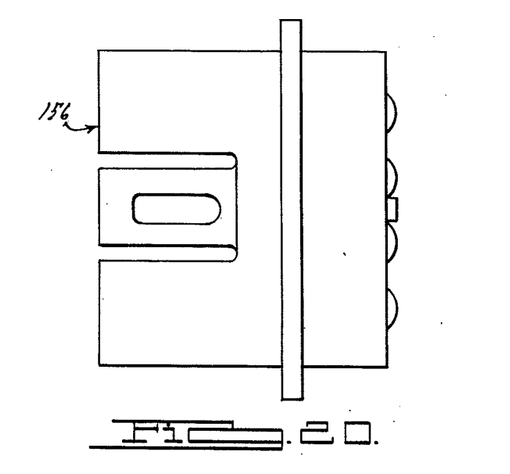
FIG. 20 is a side view of the connector plug shown in FIG. 19.

For the lower circuit board assembly 134, which is contained within element 104, there is provided only a single ledge 136 and a single locating pin 138 and boss 140, both of which are located toward the left hand side of pocket 112 as viewed in FIG. 13. The right hand side of the circuit board 134 is both located and supported by virtue of an electrical connector plug assembly 142. As best shown in FIGS. 15 and 21, circuit board assembly 134 has the connector plug 142 mounted thereon so that the connector plug extends from the circuit board downwardly through a rectangular opening 144 formed in the lower wall of housing element 104 within pocket 112. The design of the plastic shell of connector plug assembly 142 is such that when the circuit board assembly is being assembled into housing element 104 the plug assembly passes through opening 144 camming a retention tab 146 on the plug shell out of the way. As the circuit board assembly locates in the intended position, the retention tab 146 clears the wall of the housing and the inherent resiliency thereof brings the tab into interlocking engagement with the housing as shown in FIG. 15. In order to seal around opening 144 between the connector plug shell and the housing wall, a compressible sealing gasket 148 is disposed around the shell to be compressed between the housing wall and a back-up flange 150 formed around the shell. The illustrated connector plug contains four electrical terminal pins 152 which are intended to effect electrical connection of selected circuits on the circuit board assembly with mating terminal pins in a mating connector plug which mates with plug 142 to carry the circuits associated with the terminal pins to electrical devices located remotely from housing 100. With the lower circuit board assembly 134 located within pocket 112, locating pin 138 may be deformed and then potting material may be poured into the pocket to a desired fill level 154.

The upper circuit board assembly 132 is provided with an eight terminal pin connector plug assembly 156 which is similar to connector plug assembly 142. However, unlike connector plug 142, connector 156 does not pass through an opening in its own housing. Rather, connector plug 156 projects in the opposite direction relative to its mounting pocket. The connector plug 156 is so located and the two halves of the housing are so designed that when the two housing halves are assembled together, the connector plug 156 projects through a matching opening 158 in the opposite housing half. This can be seen in detail in FIG. 18 where the shell of connector plug assembly 156 passes through opening 158 and a sealing gasket 160 seals between the two in the same manner as did the seal 148 for the other connector plug with respect to its housing. It will be observed that the shell of connector plug 156 lacks any type of interlocking retention tab such as 146 for the connector plug 142. Indeed, it is desirable that the shell of connector plug assembly 156 not have any such retention tab so that the two halves of the housing may be readily separated form each other should such disassembly be necessary. By providing such an arrangement, connection of mating connector plugs is facilitated since both are adjacent. Furthermore, the arrangement is vertically compact which is desirable in a vehicle engine compartment.

Where the circuit configuration is such that electrical connections are required between the two circuit board assemblies such may be readily effected by providing terminal pins such as indicated at 162 (FIG. 10) on one of the circuit boards which project above the level of the potting material. Leadwires from the other circuit board may then be soldered to the terminal pins 162 at a level above the potting material. Where a circuit element dissipates a large amount of heat it is desirable to mount same in the path of air flow through the housing. An example is shown in FIG. 21 wherein a power transistor 164 and associated heat sink 166 are mounted on upper circuit board assembly 132. The transistor 164 is attached by means of attachment screws 168 passing through the circuit board to engage tapped holes in the mounting base of the transistor, the heat sink 166 and an insulating spacer 170 being sandwiched therebetween. Heat generated within the power transistor is dissipated via the transistor casing and heat sink to the circulating air passing through the housing. In this way the maximum temperature of the transistor is maintaied within an acceptable limit. Likewise, as mentioned in connection with the first embodiment, the invention permits the measurement of ambient temperature air by means of a temperature sensing element electrically connected in circuit with one of the circuit boards but being disposed above the level of potting material to be exposed to the ambient air passing through the circuit board housing. By way of example, the thermistor 172 in FIG. 21 can sense the temperature of the air and is preferably located upstream of the transistor and heat sink so as to not be influenced by any temperature rise in the air due to the heat dissipation by the transistor and heat sink.

Housing 100 is also designed to accommodate a transducer like the vacuum transducer shown in the first embodiment. However, the arrangement of the second embodiment in this regard offers important advantages over the arrangement of the first embodiment. As best seen in FIGS. 6 through 9, a transducer 174 mounts on housing 100 by being mechanically trapped between the two housing halves. By way of example, transducer 174 may be a vacuum-actuated variable inductance type as disclosed and claimed in copending application Ser. No. 559,204, filing date Mar. 17, 1975. This type of transducer comprises a generally cylindrical vacuum actuator portion 176 and a smaller cylindrical coil portion 178. The lower housing element 104 immediately adjacent the left hand side of pocket 112 as viewed in FIG. 13 contains a receptacle 180 into which the transducer 174 is inserted. Receptacle 180 is generally semi-cylindrically shaped and comprises an inner portion 182 which is adapted to receive the coil portion 178 of the transducer, and an enlarged outer portion 184 which is adapted to accommodate the larger diameter of the vacuum actuator portion 176 of the transducer. A groove 186 is formed in the outer portion 184 and receives the lower portion of a flange 188 provided on the transducer adjacent the juncture of the vacuum actuator portion and the coil portion. As best seen in FIG. 14, the cross section of receptacle 180, and its several portions 182, 184, and 186, is such that the surfaces thereof lies on respective truly semi-cylindrical surfaces about and below an axial centerline 189. Above the centerline 189, the respective surface portions continue as spaced parallel walls extending upwardly from the truly semi-cylindrical portions. Hence, the receptacle 180 and its portions 182, 184 and 186 may be considered as U-shaped as viewed in FIG. 14. The flange 188 on the transducer has its lower portion designed to complement the U-shaped groove 186. This shape can be seen in FIG. 9. This construction permits transducer 174 to be readily inserted into receptacle 180 so that the U-shaped flange 188 fits within and registers with the U-shaped grooves 186. When so inserted the transducer is correctly located both circumferentially and axially, and relative roation between housing element 104 and the transducer 174 about the centerline 189 is precluded. Thus, the transducer mounting arrangement advantageously provides a self-locating, anti-rotation feature, and furthermore eliminates the need for any separae mechanical fasteners. The upper housing element 102 is designed with a circularly contoured segment 190 and a circularly contoured groove 192 formed therein to engage the circularly contoured upper portion of the transducer flange 188 when the two housing halves are assembled. It will be observed that when the two housing halves are assembled, the portions of the surface 110 immediately adjacent the ends of groove 192 overlie the tops of the lower U-shaped portions of flange 188 thereby also precluding rotation of the transducer. Two electrical terminals 194, 196 at the inner end of the transducer, are connected with the lower circuit board assembly 134 by means of lead wires 198, 200 which lead from the terminals through suitable passageways formed in housing element 104. This transducer mounting and connection arrangement enhances assembly and serviceability. Also, the flange and groove seals between the housing and the transducer to prevent the intrusion of contaminants.

Figure 22:
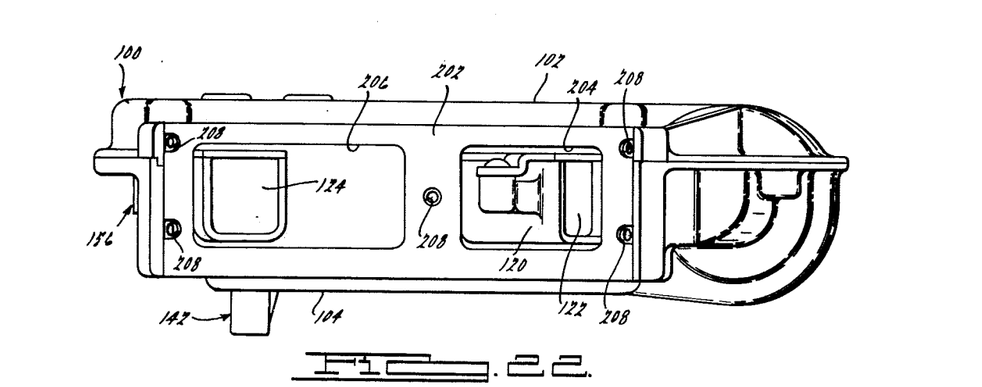
FIG. 22 is a side elevational view showing the inner face of the circuit board housing.

In the assembled unit it is desirable to adhere a sealing gasket 202 on the concave inner face of housing 100 as shown in FIG. 22. The sealing gasket includes suitable cutouts 204, 206 for the air scoop and the air discharge outlet respectively as well as cutaways 208 for the attaching holes via which the housing is attached to the air cleaner housing 14. As can be seen in FIG. 6, housing 100 is attached to air cleaner housing 14 by means of attachment screws 21 which pass through suitable holes in the side wall of the air filter housing to threadly engage matching holes provided in housing 100. This permits the housing to be conveniently attached to and removed from the air filter housing. With the provision of the sealing gasket and the design of the two housing elements, the interior of the unit is adequately sealed so that the only exterior communication is via the air inlet and outlet openings.

We claim:

1. A circuit board housing in combination with a pair of electronic circuit board assemblies comprising:
    first and second housing elements detachably secured together to form said housing;
    each of said housing elements comprising a circuit-board-assembly receiving pocket interior of the housing;
    each one of said electronic circuit board assemblies being disposed in a corresponding one of said pockets;
    an electrical connector plug assembly on each electronic circuit board assembly;
    an opening in one of said housing elements through which the electrical connector plug assembly on the circuit board assembly disposed therein extends;
    and a second opening in said one housing element through which the electrical connector plug assembly on the circuit board assembly disposed in the other housing element extends.

2. The combination of claim 1 wherein said first and second openings are separated from each other.

3. The combination of claim 1 wherein one of said openings has a continuous edge.

4. The combination of claim 1 wherein both of said openings have respective continuous edges separate from each other.

5. The combination of claim 1 including a sealing gasket sealing between each connector plug assembly and the opening through which it passes.

6. The combination of claim 1 wherein one of said connector plug assemblies comprises a mechanical interlock means thereon for mechanically interlocking with said one housing element when inserted into its opening.

7. The combination of claim 6 wherein said interlock means is on the connector plug assembly on the circuit board assembly which is disposed in the pocket of said one housing element.

8. The combination of claim 7 wherein the other connector plug assembly comprises means for permitting the same to pass freely into and out of its opening in said one housing element.

9. The combination of claim 1 wherein said circuit board assemblies overlie each other and are of generally rectangular shape.

10. The combination of claim 9 wherein said connector plug assemblies are located at the same end of their respective circuit board assemblies.

11. The combination of claim 10 wherein the same of said connector plug assemblies are generally parallel to each other.

12. The combination of claim 10 wherein said two connector plug assemblies face in the same direction.

* * * * *